United States Patent
Arguelles et al.

(12) 
(10) Patent No.: US 6,455,922 B1
(45) Date of Patent: Sep. 24, 2002

(54) DEFORMATION-ABSORBING LEADFRAME FOR SEMICONDUCTOR DEVICES

(75) Inventors: Ronaldo M. Arguelles, Baguio (PH); Reynante T. Alvarado, Tempe, AZ (US); Leonardo S. Rimpillo, Jr.; Teddy D. Weygan, both of Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/599,778

(22) Filed: Jun. 21, 2000

Related U.S. Application Data

(60) Provisional application No. 60/141,912, filed on Jun. 30, 1999.

(51) Int. Cl.[7] .............................................. H01L 23/495
(52) U.S. Cl. ...................................... 257/669; 257/670
(58) Field of Search ................................. 257/669, 670, 257/672–674, 676; 438/123, 124

(56) References Cited

U.S. PATENT DOCUMENTS

| | | | | |
|---|---|---|---|---|
| 4,803,540 A | * | 2/1989 | Moyer et al. | 257/669 |
| 4,870,474 A | * | 9/1989 | Karashima | 257/669 |
| 5,583,373 A | * | 12/1996 | Ball et al. | 257/678 |
| 5,623,123 A | * | 4/1997 | Umehara | 174/52.2 |
| 5,637,913 A | * | 6/1997 | Kajihara et al. | 257/666 |
| 5,637,915 A | * | 6/1997 | Sato et al. | 257/666 |

* cited by examiner

*Primary Examiner*—Howard Weiss
*Assistant Examiner*—Marcos D. Pizarro-Crespo
(74) *Attorney, Agent, or Firm*—Michael K. Skrehot; W. James Brady, III; Frederick J. Telecky, Jr.

(57) ABSTRACT

A leadframe structure for use with an integrated circuit chip, comprising a chip mount pad having an area smaller than said chip intended for mounting; a plurality of support members, each attached externally to the perimeter of said pad and internally to said leadframe; and each said support member having at least one portion located within the perimeter of said chip in a configuration operable to absorb thermally induced deformations of said support member.

10 Claims, 4 Drawing Sheets

DEFORMATION-ABSORBING LEADFRAME FOR SEMICONDUCTOR DEVICES

This application claims priority under 35 USC §119 based upon Provisional Patent Application No. 60/141,912, filed Jun. 30, 1999.

FIELD OF THE INVENTION

The present invention is related in general to the field of semiconductor devices and processes and more specifically to the structure, materials and fabrication of leadframes for integrated devices.

DESCRIPTION OF THE RELATED ART

The leadframe for semiconductor devices was invented (U.S. Pat. No. 3,716,764 and U.S. Pat. No. 4,034,027) to serve several needs of semiconductor devices and their operation simultaneously: First of all, the leadframe provides a stable support pad for firmly positioning the semiconductor chip, usually an integrated circuit (IC) chip. Since the leadframe including the pads is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. Obviously, the technique of wire bonding implies that reliable welds can be formed at the (inner) segment tips.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, soldering accomplishes this attachment. Obviously, the technique of soldering implies that reliable wetting and solder contact can be performed at the (outer) segment tips.

It has been common practice to manufacture single piece leadframes from thin (about 120 to 250 μm) sheets of metal. For reasons of easy manufacturing, the commonly selected starting metals are copper, copper alloys, iron-nickel alloys for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

After assembly on the leadframe, most ICs are encapsulated, commonly by plastic material in a molding process. It is essential that the molding compound, usually an epoxy-based thermoset compound, has good adhesion to the leadframe and the device parts it encapsulates. Palladium, described above as the outermost layer of the leadframe, offers excellent adhesion to molding compounds.

The leadframe not only has to tolerate an encapsulation process at elevated temperatures, but also should be amenable to good adhesion to the encapsulating material wherever the leadframe and the encapsulating material share a common boundary. The adhesion should withstand thermo-mechanical stresses and prevent the ingress of unwanted moisture and chemicals.

Experience has shown that large leadframe chip pads, introduced for supporting large area chips, have a strong tendency to delaminate from the chips, which have been attached to one pad surface by polymeric materials, and also from commonly used encapsulation materials, which surround the outer pad. The small voids thus created allow the accumulation of water molecules such that in the course of few days films of water are formed within the voids. Alternating between liquid and gaseous phases during the wide temperature swings encountered in accelerated testing, board solder attachment, and device operation, these water accumulations exert enough force on the encapsulating material to aggravate the delamination and eventually to originate microcracks. Quickly propagating, these nascent cracks frequently lead to destruction of the assembled device (known in the literature as "popcorn effect").

Numerous proposals have been discussed in the literature to avoid delamination and popcorn effect by modifying the design of the leadframe and/or the surface preparation of the leadframe material. A preferred approach is to reduce the area of the chip mount pad so that the encapsulation material obtains direct contact and thus strong adhesion to the passive surface of the chip. Examples are described in U.S. Pat. No. 5,233,222 of Aug. 3, 1993 (Djennas et al., "Semiconductor Device having Window-Frame Flag with Tapered Edge in Opening"); U.S. Pat. No. 5,327,008 of Jul. 5, 1994 (Djennas et al., "Semiconductor Device having Universal Low-Stress Die Support and Method for Making the same"); U.S. Pat. No. 5,424,576 of Jun. 13, 1995 (Djennas et al., "Semiconductor Device having X-Shaped Die Support Member and Method for Making the same"); U.S. Pat. No. 5,429,992 of Jul. 4, 1995 (Abbott et al., "Leadframe Structure for IC Devices with Strengthened Encapsulation Adhesion"); U.S. Pat. No. 5,610,437 of Mar. 11, 1997 (Frechette, "Leadframe for Integrated Circuits"); U.S. Pat. No. 5,633,528 of May 27, 1997 (Abbott et al., "Leadframe Structure for IC Devices with Strengthened Encapsulation Adhesion"); and U.S. Pat. No. 5,714,792 of Feb. 3, 1998 (Przano, "Semiconductor Device having a Reduced Die Support Area and Method for Making the same").

The undesirable consequence of all these approaches is the fact that the reduced area of the chip mount pad significantly increases the length of the straps connecting the mount pad to the leadframe. Consequently, these straps end up mechanically weakened. The temperature excursions during and after the molding process induce deformations, which frequently lead to failure of the straps due to shifting and tilting.

An urgent need has therefore arisen for a low-cost, reliable design approach for IC leadframes which provides all the assembly features leadframes are expected to offer: Immunity to the thermomechanical stresses in the molding process, adhesion to polymeric compounds, bondability and solderability. The new leadframe and its method of fabrication should be flexible enough to be applied for different semiconductor product families and a wide spectrum of design and assembly variations, and should achieve improvements toward the goals of improved process yields and device reliability. Preferably, these innovations should be accomplished using the installed equipment base so that no investment in new manufacturing machines is needed.

SUMMARY OF THE INVENTION

According to the present invention for the structure of a semiconductor integrated circuit (IC) leadframe, the chip mount pad has an area smaller than the chip intended for mounting and a plurality of support members, each attached externally to the perimeter of the pad and internally to the leadframe, and each having at least one portion located within the perimeter of the chip in a configuration operable to accommodate bending and stretching beyond the limit of simple elongation based upon inherent material characteristics.

The present invention is related to high density ICs, especially those having high numbers of inputs/outputs, and also to low end, low cost devices. These ICs can be found in many semiconductor device families such as standard linear and logic products, digital signal processors, microprocessors, digital and analog devices, high frequency and high power devices, and both large and small area chip categories. The package type can be plastic dual in-line packages (PDIPs), small outline ICs (SOICs), quad flat packs (QFPs), thin QFPs (TQFPs), SSOPs, TSSOPs, TVSOPs, and other leadframe-based packages.

It is an aspect of the present invention to provide a leadframe having the mount pad support members designed so that they absorb thermomechanical stress exerted during the molding encapsulation process, accelerated testing involving temperature and moisture variations, and the device operation.

Another aspect of the present invention is to design the geometries of the pad support members so that they include portions which provide bending and stretching beyond the limit of simple elongation based upon inherent material characteristics.

Another aspect of the present invention is to avoid deformation, shifting or tilting of the pad support members during the molding process.

Another aspect of the present invention is to design the pad support members so that at least two of them intersect at a point near the center of the chip mount pad.

Another aspect of the invention is to maximize the stress-absorbing feature of the pad support members by designing the thickness of the intersecting members greater than the remaining portions of the members.

Another aspect of the invention is to reach these goals without the cost of equipment changes and new capital investment, by using the installed fabrication equipment.

These aspects have been achieved by the teachings of the invention concerning the geometries, the intersection and the thickness of the support members, and have been applied to whole families of IC chips of various chip areas.

In the first embodiment of the invention, the chip mount pad support members provide portions having a meandering or sinusoidal geometry within the perimeter of the chip. The design of these support member portions contributes 50 to 500% over the contribution of the material elongation to the support member stretching.

In the second embodiment of the invention, the support member portions of the first embodiment, located within the perimeter of the chip, are enhanced by additional support member portions of meandering geometry, located outside the perimeter of the chip.

In the third embodiment of the invention, the chip mount pad support members intersect at a point near the center of the chip mount pad. In a preferred embodiment, the thickness of the intersecting members is greater than the thickness of the remaining portions of the support members.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
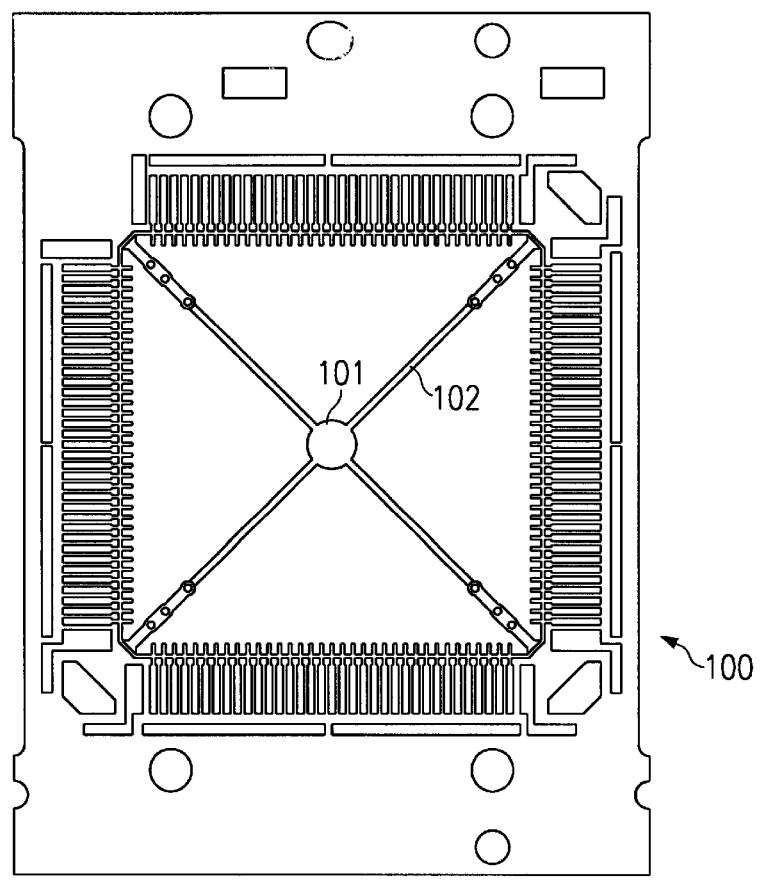
FIG. 1 is a simplified top view of an individual IC leadframe illustrating the plurality of support members of the chip mount pad.

The invention relates to a single piece metallic leadframe that can be used in current semiconductor device production processes and installed equipment base. FIG. 1 depicts a single, rectangular-shaped leadframe unit, generally designated 100, for a typical semiconductor Quad Flat Pak (QFP) device. Specifically, the leadframe for a 144-lead plastic thin QFP is shown; dimensions of the finished device after molding are 20×20×1.4 mm. In the center is the chip mount pad 101. It has dimensions considerably smaller than the chip perimeter, a method generally adopted to prevent the so-called "pop-corn" effect. In the device assembly process, the mount pad receives the chip attach polymer, thus enabling the chip mount process.

Further, the leadframe unit 100 includes a plurality of support members 102, which extend from the leadframe rails to the chip mount pad 101. In the example of FIG. 1, the QFP device requires 4 support members connecting the mount pad 101 to the four corners of the rectangular leadframe. Due to the reduced mount pad size, the support members 102 are excessively long. The design of the leadframe illustrated in FIG. 1 is herein called Design A.

Suitable sheet-like starting materials of the leadframe typically have a thickness in the range from about 100 to 300 μm. Suitable materials include copper, copper alloy, brass, aluminum, iron-nickel alloy and invar. Portions of the leadframe may also be plated, selectively or by flood plating techniques, with highly conductive metals, such as silver, copper, gold, nickel, or palladium. Chip mount pad and support members (and other features) of the leadframe may be stamped or etched from the sheet-like starting material.

As a consequence of the considerable length of the support members 102, the manufacturing process flow of devices using leadframe 100 has some difficulties. The mechanical strength of support members 102 is decreased; elevated process temperatures (as during wire bonding and encapsulation molding) frequently induce deformations such as support member tilting or shifting, or shifting of the mount pad.

Several processes in the assembly flow of semiconductor devices require elevated temperatures. For example, wire bonding is performed between about 170 and 280° C., typically about 240° C. The bonding wires are selected from a group consisting of gold, copper, aluminum, and alloys thereof. Encapsulation molding is performed between about 160 and 190° C., typically 175° C. The encapsulation material is a polymeric material selected from a group consisting of epoxy-based molding compounds suitable for adhesion to silicon chip surfaces. In these operations, the leadframe is usually clamped at the rails to insure stability. Consequently, the expansion of the leadframe material during the time at elevated temperature needs a mechanism which absorbs the additional length, especially of the support members. Preferably, this absorption mechanism has to be operable in three dimensions, since the thermal expansion extends into the X, Y and Z directions, however usually not in equal amounts, since the degree of freedom depends on the clamping mechanism and on the capability of moving in an unobstructed manner. The mount pad support members 102 in FIG. 1 can move in all three directions X, Y, and Z.

As defined herein, the X and Y directions are in the plane of the leadframe, as given by the sheet-like starting material, and the Z direction is vertical to this plane. Actually, the Z direction only applies to the support members, because only the support members exhibit the so-called "downset". This downset is employed in most leadframes for technical reasons of wire bonding. Due to the downset, the chip mount pad obtains a horizontal plane slightly offset (about 10 to 20 $\mu$m) from the plane of the leadframe, and the support members which connect the chip mount pad with the leadframe now have to be slightly formed to accommodate the required step between the two planes.

Figure 7:
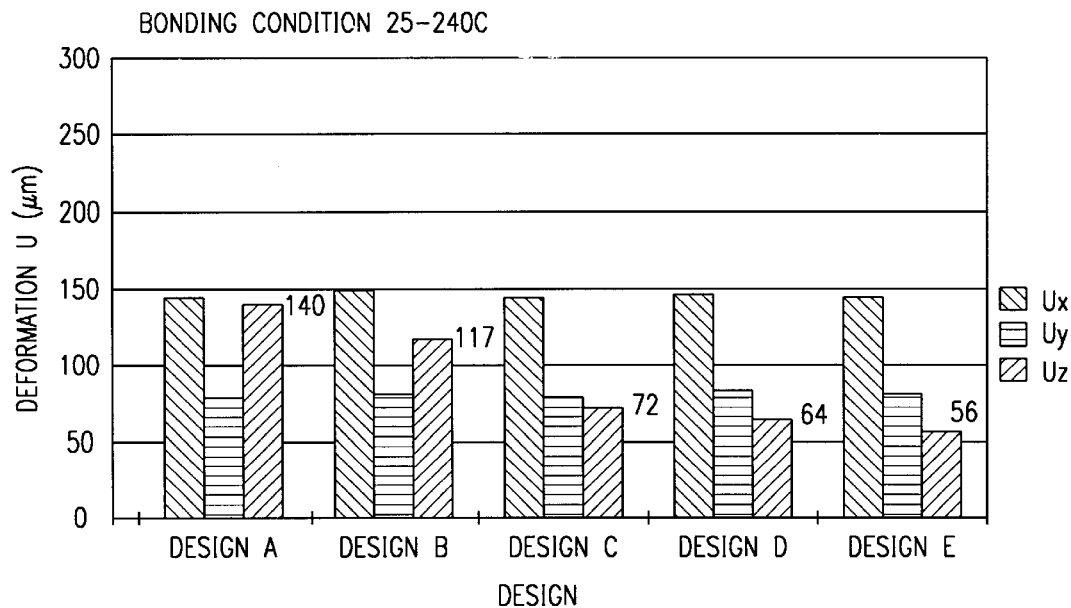
FIG. 7 illustrates the benefit of the invention for absorbing deformation of the mount pad support member during the wire bonding process step.
Figure 8:
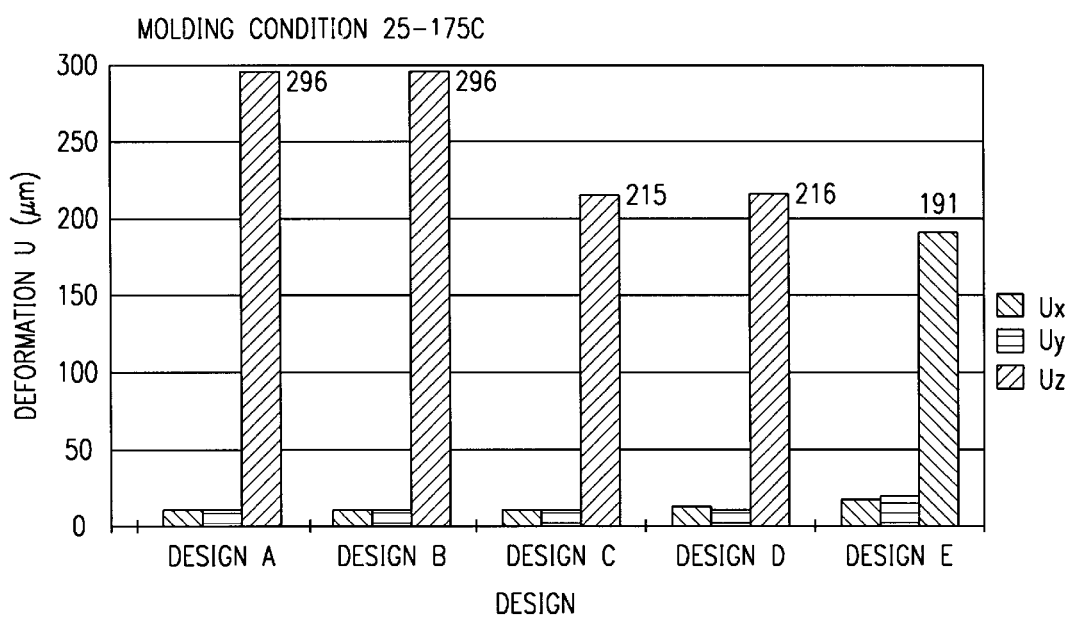
FIG. 8 illustrates the benefit of the invention for absorbing deformation of the mount pad support member during the encapsulation molding process step.

The actual deformations can be measured by visual inspection after wire bonding, and by X-ray inspection after molding. It has been found that these observations show excellent agreement with modeling results, calculated by finite-element analysis (using for instance commercial software ANSYS 5.0 A). In FIGS. 7 and 8, the modeling results are displayed as deformations U (in $\mu$m) in the X, Y, and Z directions (Ux, Uy, and Uz) for various support member designs. FIG. 7 illustrates the deformations during the wire bonding process using temperature excursions from 25 to 240° C., FIG. 8 illustrates the deformations during the encapsulation molding process using temperature excursions from 25 to 175° C.

The first set of deformations in FIGS. 7 and 8 refer to Design A, the conventional leadframe of FIG. 1 without the improvements of the invention.

To solve the problem of the deformations U requires a method different from the mechanical bending and forming method described for semiconductor leadframes in U.S. patent application Ser. No. 08/926,150, filed on Sep. 9, 1997 (Carter et al., "Bending and Forming Method of Fabricating Exposed Leadframes for Semiconductor Devices"). The method of that application uses an outside force to stretch a leadframe segment into a final geometrical shape. A force applied along the length of a segment can stretch the segment in the direction of the length, while the dimension of the width is only slightly reduced, so that the new shape appears elongated. However, if an elongation is needed which would exceed the elastic limit of the leadframe material, the patent application describes geometries of leadframe, which can accommodate stretching considerably beyond the limit of simple elongation based on inherent material characteristics.

Figure 2:
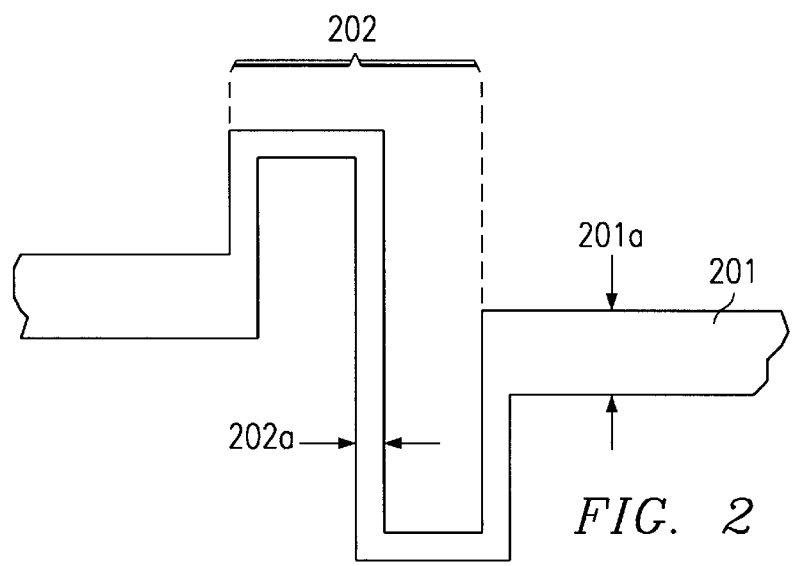
FIG. 2 is a schematic top view of a portion of a mount pad support member according to the invention.

FIG. 2 illustrates an example of a portion of a support member designed so that the structure accommodates segment elongation, bending and stretching beyond the limit of simple expansion or elongation based upon inherent material characteristics. The structure of FIG. 2 functions as the deformation-absorbing portion of the support member. The example of FIG. 2 shows a meandering or sinusoidal geometry 202 inserted into support member 201. The geometry of the insert may have a variety of shapes. For example, the geometry may include: rectangular or rounded corners; segments portions joined at right angles or at inclined angles; one or more repetitions of wave forms; and material width 202a reduced within the geometry compared to support member width 202a, or identical width. In another modification, the inserted structure may provide a plurality of bendings.

Figure 3:
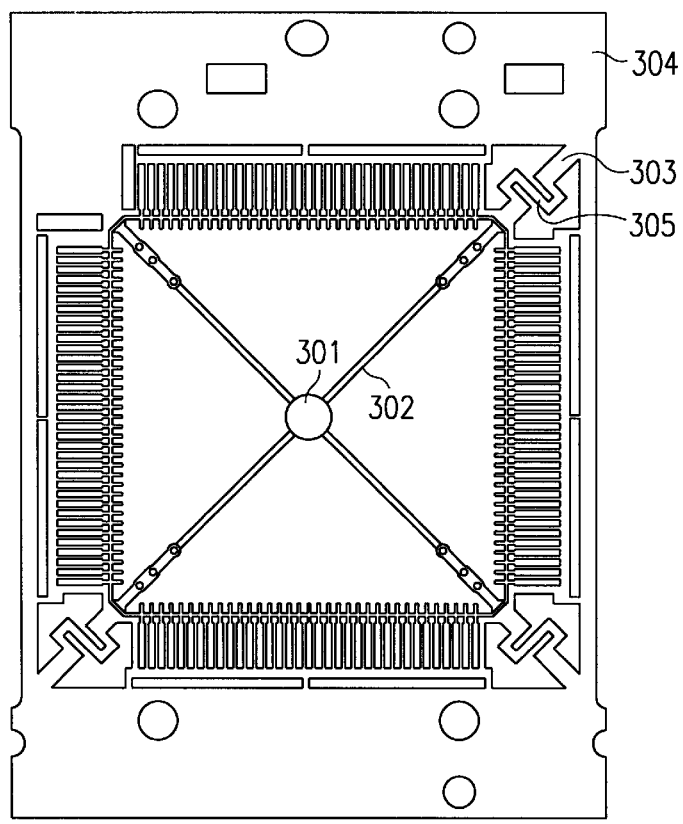
FIG. 3 is a simplified top view of an individual IC leadframe having a plurality of chip mount pad support members, including portions as illustrated in FIG. 2 in locations outside the perimeter of the chip.

According to the present invention, it is important on which location along the support member length the absorbing structure of FIG. 2 is inserted. In FIG. 3, the location is selected close to the end points 303 of the support members 302, near the connection to the leadframe rails 304 and remote from the chip mount pad 301. At this location, the structures 305 are able to absorb some deformations during the assembly steps of wire bonding and encapsulation molding, but they are discarded in the trimming step after the assembly processes, together with leadframe rails 304. The leadframe design displayed in FIG. 3 is called Design B.

The deformations U of Design B during the wire bonding process are displayed in FIG. 7, and those during the encapsulation molding process in FIG. 8. As can be seen, compared to the deformations of leadframe Design A, the benefits of the deformation-absorbing structures in FIG. 3 are marginal. Only in the wire bonding process is the deformation Uz in the Z-axis somewhat reduced.

Figure 4:
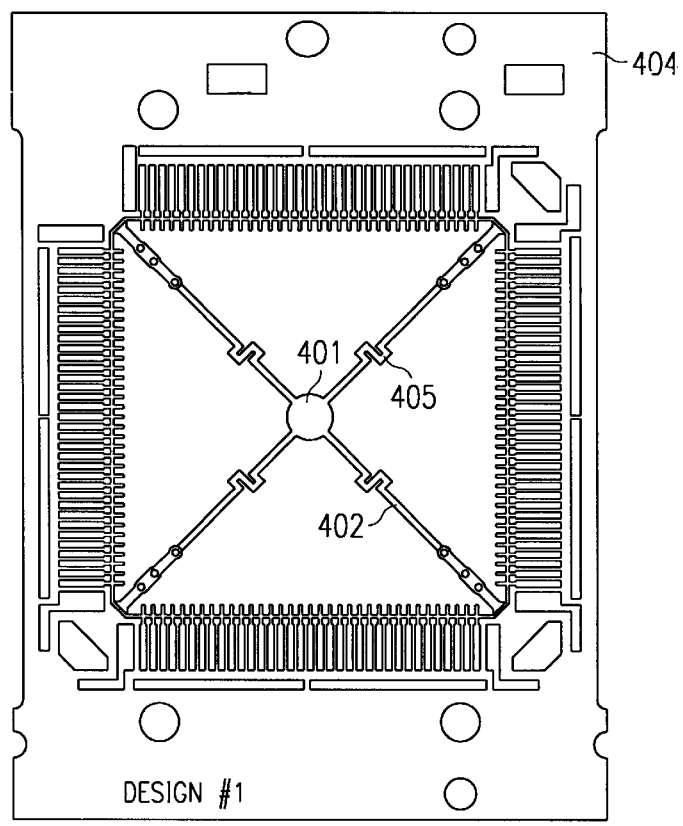
FIG. 4 is a simplified top view of an individual IC leadframe according to the first embodiment of the invention.

The first embodiment of the invention is displayed in the leadframe Design C of FIG. 4. The deformation-absorbing structures 405 are inserted into the plurality of support members 402 in locations within the perimeter of the chip. The chip itself is to be attached to chip mount pad 401. Furthermore, two of the support members 402 intersect at a point near the center of chip mount pad 401. As a consequence of selecting this location, the deformation-absorbing structures remain within the package of the finished semiconductor device and are not discarded with rails 404 in the trimming process.

The configuration of Design C together with the location of the structure 405 within the perimeter of the chip is operable to, accommodate bending and stretching beyond the limit of simple elongation based upon inherent material characteristics. The geometry of structures 405 is designed so that it contributes 50 to 500% over the contribution of the leadframe material elongation to the stretching of support members 402. Consequently, structures 405 are capable of absorbing significant amounts of deformation in all assembly processes involving elevated temperatures. FIG. 7 shows the substantial reduction of deformation Uz in the Z-direction, which Design C can provide during the wire bonding process involving a temperature excursion from 25 to 240° C. FIG. 8 shows the substantial reduction of deformation Uz in the Z-direction, which Design C can provide during the encapsulation molding process involving a temperature excursion from 25 to 175° C.

Figure 5:
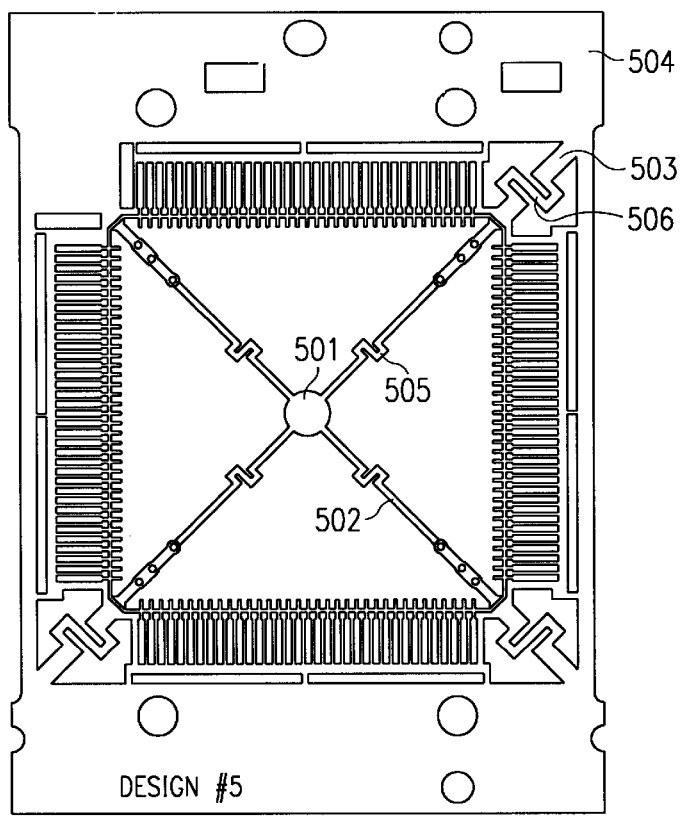
FIG. 5 is a simplified top view of an individual IC leadframe according to the second embodiment of the invention.

The second embodiment of the invention is displayed in the leadframe Design D of FIG. 5. Chip mount pad 501 provides area for attaching the chip. A first plurality of deformation-absorbing structures 505 is inserted into the plurality of support members 502 in locations within the perimeter of the chip. Two of the support members 502 intersect at a point near the center of chip mount pad 501. A second plurality of deformation-absorbing. structures 506 is inserted into the plurality of support members 502 in locations outside the perimeter of the chip. For instance, these locations may be, but do not have to be, close to thee end points 503 of the support members 502, near the connection to the leadframe rails 504.

As a consequence of selecting these locations, the deformation-absorbing structures 505 remain within the package of the finished semiconductor device and are not discarded with rails 504 in the trimming process, while the deformation-absorbing structures 506 are discarded with rails 504 in the trimming process.

As can be seen in FIGS. 7 and 8, Design D offers only little benefit in deformation absorption over Design C. This result is in agreement with the model findings relative to Design B in FIG. 3.

Figure 6:
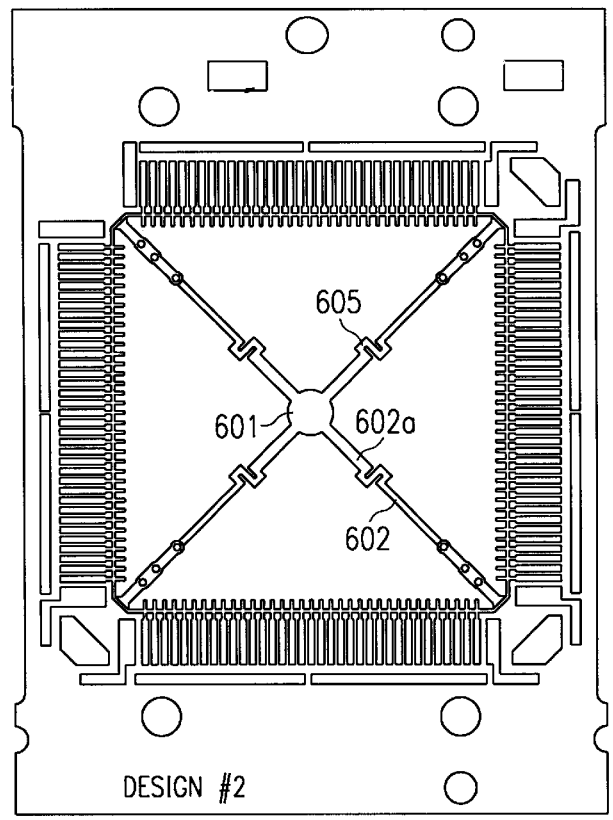
FIG. 6 is a simplified top view of an individual IC leadframe according to the third embodiment of the invention.

The third embodiment of the invention is displayed in the leadframe Design E of FIG. 6. Chip mount pad 601 provides area for attaching the chip. A plurality of deformation-absorbing structures 605 is inserted into the plurality of support members 602 in locations within the perimeter of the chip. Two of the support members 602 intersect at a point near the center of chip mount pad 601. It is important that the width 602a of the intersecting support members is greater than the remaining portions of the support members, because this added material strength reinforces the deformation-absorbing capability of the structures 605. The increased width 602a is between about 50 to 150% wider than the width of the remaining support member; a preferred increase is 100%.

The finite-element modeling results of FIGS. 7 and 8 confirm the noticeable deformation-absorbing improvement of the added material strength in Design E. Structures 605 combined with the strengthened support member portions 602a are capable of absorbing significant amounts of deformation in all assembly processes involving elevated temperatures. As compared to the conventional leadframe Design A, FIG. 7 shows the excellent reduction of deformation Uz in the Z-direction, which Design E can provide during the wire bonding process involving a temperature excursion from 25 to 240° C. 60% of the conventional deformation is absorbed by Design E. As compared to the conventional leadframe Design A, FIG. 8 shows the substantial reduction of deformation Uz in the Z-direction, which Design E can provide during the encapsulation molding process involving a temperature excursion from 25 to 175° C. About 36% of the conventional deformation are absorbed by Design E.

The high level of absorption of support member deformation, provided by the embodiments of the invention, eliminates undesirable effects such as shifting of the chip mount pad during the molding process, or tilting or lateral shifting of the support members during bonding and molding processes.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, instead of only a single structure inserted into the support members for deformation absorption, two or more structures may be used, not necessarily in equal numbers per support member. It is therefore intended that the appended claims encompass any such modifications or embodiments.

We claim:

1. A metal leadframe and associated structure for use in combination with an integrated circuit chip, comprising:

a chip mount pad having an area smaller than said chip intended for mounting; and a plurality of pad support members, each attached to the perimeter of said pad and to said leadframe;

each of said support members having at least one metal portion located within the perimeter of said chip in a configuration operable to absorb thermally induced deformations of said support members.

2. The leadframe and associated structure according to claim 1 further having a support member portion located outside the perimeter of said chip, configured in a geometry to absorb thermally induced deformations of said support member.

3. The leadframe and associated structure according to claim 1 having a thickness in the range from about 100 to 300 μm.

4. The leadframe and associated structure according to claim 3 comprising a metal or alloy selected from group consisting of copper, copper alloy, brass, aluminum, iron-nickel alloy, and invar.

5. The leadframe and associated structure according to claim 1 wherein said at least one metal portion has a meandering geometry.

6. The leadframe and associated structure according to claim 1 wherein said at least one metal portion has sinusoidal geometry.

7. The leadframe and associated structure according to claim 1 wherein said support member can accommodate a plurality of bendings.

8. A semiconductor device comprising:

a metal leadframe and a chip mount pad; an integrated circuit chip mounted on pad, said pad having an area smaller than said chip, and a plurality of support members, each attached externally to the perimeter of said pad and internally to said leadframe;

each of said support members having at least one metal portion located within the perimeter of said chip in a configuration operable to absorb thermally induced deformations of said support member.

9. A device as in claim 8 wherein said at least one metal portion has a meandering geometry.

10. A device as in claim 8 wherein said at least one metal potion has a sinusoidal geometry.

* * * * *